United States Patent [19]

Tanaka

[11] 3,956,702

[45] May 11, 1976

[54] BAND DECODER FOR ALL-CHANNEL DIGITAL TUNING SYSTEM

[75] Inventor: Akio Tanaka, Evanston, Ill.

[73] Assignee: Zenith Radio Corporation, Chicago, Ill.

[22] Filed: July 1, 1974

[21] Appl. No.: 484,475

[52] U.S. Cl.............................. 325/459; 325/464; 325/470
[51] Int. Cl.² .......................................... H04B 1/32
[58] Field of Search ........... 325/452, 453, 458, 459, 325/464–466, 468–470; 334/11, 14, 15; 340/147 C, 171 A, 168 R

[56] References Cited
UNITED STATES PATENTS

| | | | |
|---|---|---|---|
| 3,748,645 | 7/1973 | Kawashima | 325/465 |
| 3,800,230 | 3/1974 | Marks | 325/465 |
| 3,818,353 | 6/1974 | Sakamoto | 325/470 |
| 3,845,394 | 10/1974 | Hamada | 325/464 |
| 3,846,707 | 11/1974 | Sakamoto et al. | 325/470 |

Primary Examiner—George H. Libman
Assistant Examiner—Jin F. Ng
Attorney, Agent, or Firm—Joseph T. Downey; Nicholas A. Camasto

[57] ABSTRACT

An electronic all-channel television tuning system has a channel number computer including a presettable counter for deriving the number of the receivable television channel by counting, on a continuing sample basis, the tuner local oscillator frequency. The local oscillator frequency is varied by a voltage ramp circuit under the control of a comparator. The derived channel number is supplied to one input of the comparator, and a channel number selector supplies an encoded desired channel number both to the other comparator input and to a decoder for determining the appropriate frequency band in which the signal corresponding to the desired channel number lies. The decoder develops and supplies signals to establish for the presettable counter appropriate preset information corresponding to each of the four disconnected FCC frequency bands.

14 Claims, 4 Drawing Figures

TABLE 1
BINARY - DECIMAL
ST'D REPRESENTATION

| D C B A | | D C B A | |
|---|---|---|---|
| 0 0 0 0 | 0 | 0 1 0 1 | 5 |
| 0 0 0 1 | 1 | 0 1 1 0 | 6 |
| 0 0 1 0 | 2 | 0 1 1 1 | 7 |
| 0 0 1 1 | 3 | 1 0 0 0 | 8 |
| 0 1 0 0 | 4 | 1 0 0 1 | 9 |

TABLE 3
PRESET INFORMATION

| BAND | MOD. STATE | UNITS | TENS |
|---|---|---|---|
| 1 | 5 | 5 | 8 |
| 2 | 1 | 5 | 8 |
| 3 | 5 | 0 | 7 |
| 4 | 3 | 8 | 2 |

TABLE 2
BAND DECODER

| FCC BAND | CH. NO. RANGE | BA | BB | NAND 217 | B1 | B2 | B3 | B4 |
|---|---|---|---|---|---|---|---|---|
| 1 | 2-4 | 0 | 0 | 1 | 0 | 1 | 1 | 1 |
| 2 | 5-6 | 0 | 1 | 1 | 1 | 0 | 1 | 1 |
| 3 | 7-13 | 1 | 1 | 1 | 1 | 1 | 0 | 1 |
| 4 | 14-83 | 1 | 0 | 0 | 1 | 1 | 1 | 0 |

FIG. 4.

BAND DECODER FOR ALL-CHANNEL DIGITAL TUNING SYSTEM

CROSS REFERENCE TO RELATED PATENT APPLICATIONS

This application is related to the following applications all of which are assigned to the assignee of the present application and all of which are hereby incorporated by reference. Ser. No. 326,724, filed Jan. 26, 1973, now U.S. Pat. No. 3,851,254, entitled "Digital Systems and Method for Determining and Displaying a Television Channel Number", in the names of Richard G. Merrell and Akio Tanaka, Ser. No. 430,446, filed Jan. 3, 1974, entitled "Channel Seeking Tuning System", in the name of Akio Tanaka (hereafter referred to simply as the Tanaka application), Ser. No. 457,010, filed Apr. 1, 1974, entitled "Digital Signal Seeking Tuning System", in the names of John Ma and Akio Tanaka and Ser. No. 466,579, filed May 3, 1974, entitled "All Electronic Digital Tuner System with Memory" in the names of John Ma and Akio Tanaka.

BACKGROUND OF THE INVENTION

1. Field of the Invention

The present invention relates generally to all-channel television tuning systems and more particularly to an electronic tuning system having a time sequenced presettable counting system for determining the system tuning condition by counting the frequency of a tunable element such as a local heterodyne oscillator.

1. Description of the Prior Art

U.S. Pat. No. 3,753,119 issued Aug. 14, 1973, to Close shows a digital indicator for periodic display of the signal frequency to which a receiver is tuned. A counter is preset and supplied with a submultiple of the corresponding receiver local oscillator frequency for a prescribed time interval such that the counter output denotes the actual received frequency (or corresponding television channel number depending upon manual selection of the appropriate frequency band). The Close patent avoids the complex counting problem encountered in the VHF television spectrum, which comprises three irregularly spaced frequency bands, by directly inserting VHF television channel numbers into the counter through "hard wired" circuits for display.

A system employing channel number information to produce tuning is described in U.S. Pat. No. 3,778,736 issued Dec. 11, 1973, to Sakamoto, and shows a pair of memory circuits connected to a matrix network for directing binary coded channel number signals to a set of logic gates to selectively connect one of a set of voltage dividing networks to appropriate variable capacitance diodes (varactors) for tuning. The matrix converts the channel number into an appropriate matrix position and provides numbered positions from 1 to 62, with the first 12 positions reserved for VHF channels.

The only band discrimination is that for switching the VHF tuner between a low and high band. The outputs of the first three voltage positions (corresponding to channel numbers 2, 3 and 4) are coupled to a NOR gate for operating the tuner in its low band mode. The next seven voltage positions, numbered 4 to 12 (channel numbers 5 to 13) have their outputs coupled to a NAND gate for operating the tuner in its high band mode.

In the system disclosed in the above mentioned Tanaka application a modular counter is reset to count the local oscillator frequency on a sample basis and supply channel number information to a comparator, to the other input of which is supplied the desired channel number information. The comparator output is used to control a ramp drive voltage source for changing the tuner oscillator frequency. The counters are supplied individual presets for the four frequency bands embracing all allocated FCC channels. The band decoder utilized in this inventive combination distinguishes four groups of channel numbers 2, 3 and 4; 5 and 6; 7–13 and 14–83. Appropriate presets are loaded into the counters in accordance with the frequency band in which the television signal corresponding to the selected channel number lies.

OBJECTS OF THE INVENTION

An object of this invention is to provide a novel all channel television tuning system and method;

It is another object of this invention to provide an improved all channel tuning system and method in which tuning is performed automatically in response to channel number input.

SUMMARY OF THE INVENTION

In accordance with the inventive apparatus and method an all-electronic all-channel tuning system includes presettable counters for determining the channel number of the television signal receivable by the system by time sampling the frequency of a tunable element in the system. This information is supplied to a comparator which also accepts information from a channel number selector. The comparator controls a ramp voltage circuit which drives the tunable element to change frequency in response to the state of comparison. Means are provided for determining the frequency band of the selected channel number and developing and establishing appropriate presets in the counters.

BRIEF DESCRIPTION OF THE DRAWINGS

The features of the present invention which are believed to be novel are set forth with particularity in the appended claims.

The invention, together with further objects and advantages thereof, may best be understood by reference to the following description taken in conjunction with the accompanying drawings, in the several figures of which like reference numerals identify like elements, and in which:

FIG. 3 comprises Tables 1, 2 and 3 where:

Table 1 shows the standard binary representation of decimal numbers;

Table 2 shows the channel bands, corresponding channel numbers, and the binary coding used on the BA and BB leads, VHF-UHF discriminator NAND 217 and band signal leads B1-B4; and Table 3 shows the preset information in decimal form for counter blocks 62, 64 and 66 corresponding to each band determination.

DESCRIPTION OF THE PREFERRED EMBODIMENT

The full details of the structure and operation of the entire tuning system are set forth in detail in the above Tanaka application which has been incorporated by reference. The specification for the present application contains only material germane to this invention. Its relationship to the entire tuning system is described by a block diagram.

Figure 1:
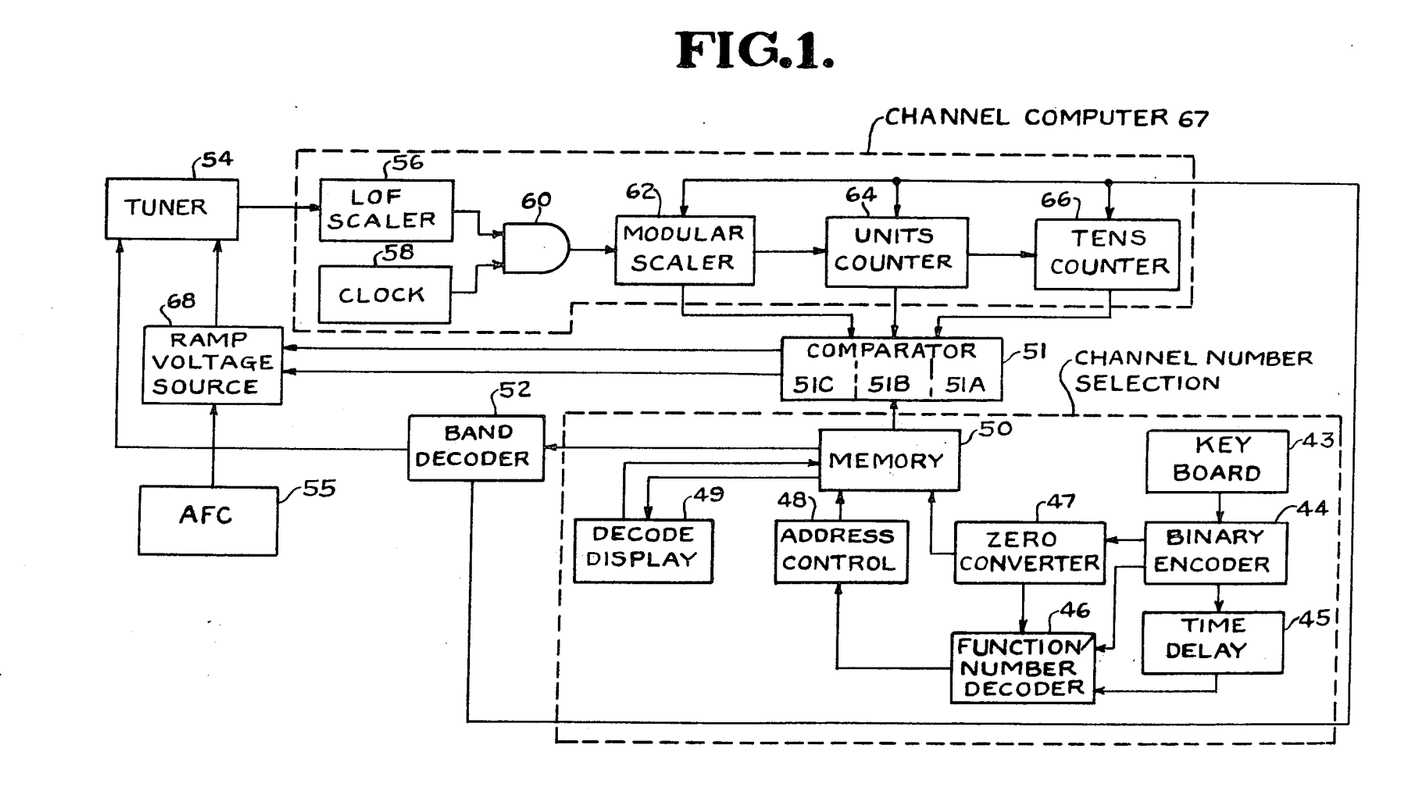
FIG. 1 depicts, in block diagram form, a tuning system employing the invention.

FIG. 1 is a block diagram depicting a tuning system incorporating the invention. A channel number keyboard 43 includes means for entering either desired channel number information or tuning commands to tune the tuner. The keyboard information is encoded into a special binary representation in encoder 44, supplied to a zero converter 47 and, both directly and through a time delay system 45, to a function/number decoder 46. The purpose of time delay system 45 is to eliminate spurious signals which might be generated by keyboard contact bounce. The directly supplied information to decoder 46 assists in the determination of the proper address or position in a memory 50. Zero converter 47 functions to alter a special binary representation used in the encoder to the standard binary representation employed in the remainder of the system. The output of zero converter 47 supplies channel number information to decoder 46 and to a designated position in memory 50.

The keyboard input can be either a channel number digit or an Up or Down tuning command. The word "command" is used to indicate an Up or Down signal input. The function/number decoder firstly determines which of an Up or Down command has been given and secondly distinguishes between commands and channel numbers. If an Up or Down command is entered at the keyboard, address control 48 causes an advance to the next position of the memory. Additional commands result in address control 48 sequentially indexing memory 50 through its available memory positions. Connected to the output of memory 50 is a decode display 49 which provides a visual indication of the channel number at that memory address. Thus, the viewer receives a visual indication of the selected channel information.

The tuning system has two functional modes designated program and operate. In the program mode, information is entered by the keyboard and stored in the memory by the sequence of an Up or Down command which cause a serial advancement of accessible memory address positions followed by entry of the channel number information into the memory from the keyboard. In the operate mode, an Up or Down command causes advancement to the next sequential address position and information is supplied from the memory to a comparator 51 to cause tuning to the channel represented by the stored channel information. In this mode, a particular location or "scratch pad" memory position is automatically accessed upon the input of a channel number at the keyboard and permits direct tuning by the viewer to any selected channel.

Another output of memory 50 is connected to a band decoder 52 which determines, from the encoded channel information stored in memory 50, (1) in which of the several discontinuous frequency bands the selected channel is; (2) whether UHF or VHF circuitry in the tuner is activated; and (3) the preset information supplied to the channel computing means for decoding of the oscillator frequency. Thus, an output of band decoder 52 is connected to a varactor tuner 54 and another output is connected in common to a modulator scaler 62, a units counter 64 and a tens counter 66. A conventionally derived automatic frequency control voltage source (AFC) 55 is coupled to a ramp voltage source 68 for maintaining the oscillator frequency tuned to the received signal picture carrier frequency.

The output of a local oscillator frequency (LOF) scaler 56 and the output of a clock pulse generator 58 are coupled to the inputs of a logic gate 60. Clock pulse generator 58 produces repetitive distinct timing intervals which are labelled reset, count and compare. These permit initiation of the various functions in proper synchronism with all elements of the tuning system. The signal on the output of gate 60 constitutes the tuning information and comprises a train of oscillator frequency-related pulses in fixed time intervals. The oscillator frequency is determined by counting the number of pulses in an interval. The output of logic gate 60 is connected to modular scaler 62 which, in turn, is connected to units counter 64 which, in turn, is connected to tens counter 66. On a time sample basis, the tuning information is supplied to the appropriately preset modular scaler and counters which, in the preferred embodiment, determine the channel number corresponding to the television frequency to which the tuner is tuned. The circuitry from the LOF scaler to the comparator constitutes the channel computing means.

The outputs of modular scaler 62 and counters 64 and 66 are connected to comparator 51 which has a modular section 51C, a units section 51B and a tens section 51A, where the derived channel number is compared with the desired channel number. As each comparison is made, signals dependent upon the condition of comparator 51 are coupled to ramp voltage source 68 for controlling both the tuning voltage direction and rate of change. The output voltage from ramp voltage source 68 drives tuner 54 to make corrective changes in its local oscillator frequency, until comparator 51 indicates equality between the derived channel number and desired channel number and, as fully described in the Tanaka application, that the tuned signal is within a range of frequencies preselected by the window.

Blocks 56, 58, 60, 62, 64 and 66 are shown enclosed by a broken line labelled 67 to represent the channel computer section of the system which derives channel numbers of receivable television signals by counting the oscillator frequency with the proper preset values.

Blocks 43, 44, 45, 46, 47, 48, 49 and 50 are shown enclosed by a broken line and represents the channel number selection section of the tuning system. It should be noted that as with the Tanaka application, the preferred embodiment employs a sequentially accessible memory.

DEFINITIONS

For simplicity, only logic connections are shown in the figures and only voltage sources and grounds necessary to establish the logic control signal levels are shown. Positive logic is used throughout and logic gates are simply referred to by their functional names, i.e., AND, NAND, OR and NOR, without the word "gate". A 1 represents a high logic (or signal voltage) level and a 0 corresponds to a low logic level. Thus, an AND gate has its output at 1 only if all inputs are at 1; a NAND gate has its output at 0 only if all inputs are at 1; an OR gate has its output at 1 if any input is at 1; and a NOR gate has its output at 0 if any input is at 1. Inverters function to interchange the 1 and 0 levels.

All binary representations are conventionally arranged in descending powers of 2 from left to right. Leads labelled D, B, C and A interchangeably represent binary digits or bits as well as lead identification. Similarly leads may be identified by the functional signals they carry.

The terms "input" and "output" generally indicate the device terminal unless signal is specified. An open circle on an input terminal designates a negative edge triggered device. $\phi$ represents a timing pulse signal and $\bar{\phi}$ its inverse or complement. If $\phi$ is 0, $\bar{\phi}$ is 1 and vice-versa. The term "inhibit" indicates the condition in which a gate output is no longer dependent upon signals applied to its remaining inputs. The term "enable" designates the condition in which a gate output is dependent upon the signals applied to the remaining inputs.

Figure 2:
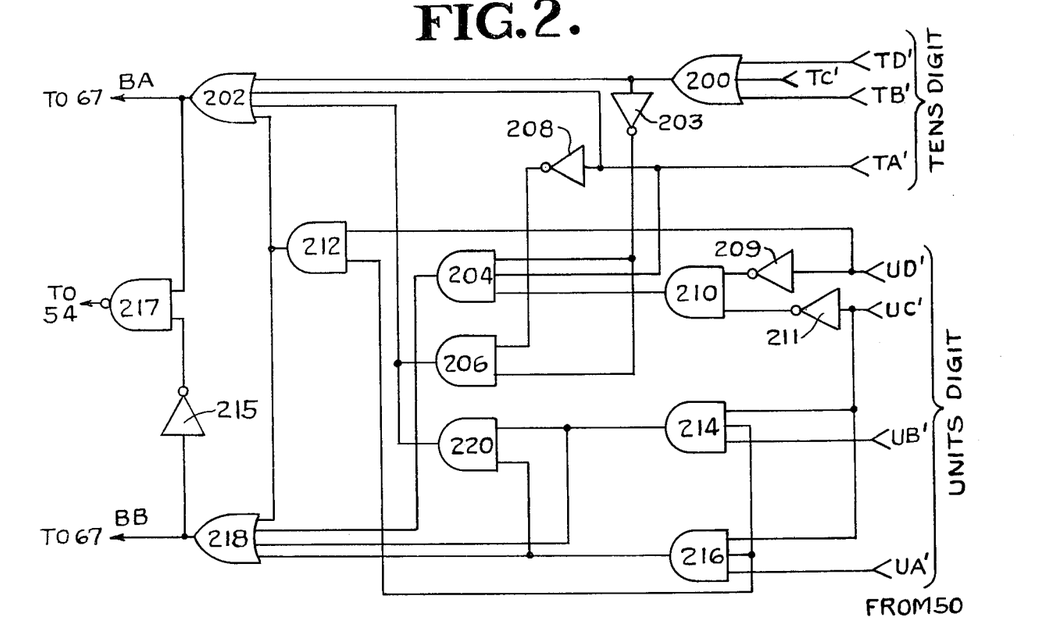
FIG. 2 shows the circuitry of block 52 which comprises the band decoder of the system.

Band Decoder 52 (FIG. 2)

FIG. 2 shows band decoder 52 which determines the appropriate frequency band of the binary encoded channel numbers in the memory. The frequency band determination is necessary to insure that the correct preset information is supplied to the counters. A separate binary coding of leads BA and BB is used to designate the four channel bands (see Table 2 of FIG. 3). Tens memory leads TB', TC' and TD' are connected to the inputs of an OR 200, the output of which is connected to one input of an OR 202 and, through an inverter 203, to one input of an AND 204 and one input of an AND 206. Lead TA' is connected to a second input of AND 204, a second input of OR 202 and, through an inverter 208, to a second input of AND 206.

Units memory lead UD' is connected to an input of an AND 212 and, through an inverter 209, to one input of an AND 210. Lead UC' is connected to one input of an AND 214, one input of AND 216 and, through an inverter 211, to a second input of AND 210. Lead UB' is connected to a second input of AND 214 and lead UA' is connected to a second input of AND 216. The output of AND 210 is coupled to the third input of AND 204. The output of AND 214 connects to one input of an AND 220 and one input of an OR 218. The output of AND 216 is coupled to the second input of AND 220 and to a second input of OR 218. The output of AND 204 is connected to a third input of OR 218. The output of AND 206 is connected to the second input of AND 212 and back to the third inputs of AND 214 and AND 216. The output of AND 220 is connected to a third input of OR 202 and the output of AND 212 is coupled to the fourth inputs of OR 202 and OR 218. The output of OR 202 is labelled BA and the output of OR 218 is labelled BB, which correspond to the signals in Table 2 of FIG. 3.

A NAND 217, functioning as a VHF-UHF discriminator, has one input connected to BA and its other input, connected through an inverter 215, to BB. Its output is coupled to tuner 54 for selectively activating the UHF and VHF tuners and a 0 level signal output indicates a UHF channel, whereas a 1 level output indicates a VHF channel.

The operation of the band decoder is as follows. The output OR 200 is at 0, only when TB', TC' and TD' are all at 0, corresponding to the binary condition 000X, which restricts the tens digit to the range of 2 to 9. Thus, the output of OR 200 is at 1 for channel numbers 20 to 99 and is at 0 for channels 0–19.

The AND 210 output is at 1 when both UD' and UC' are at 0 corresponding to binary 00XX (a decimal range of 0 through 3) for the units digit. The outputs of AND 204 is at 1 when OR 200 is at 0, TA' is at 1 (only for an odd tens digit) and AND 210 is at 1. Hence the channel number must be between 0 and 19 and have an odd tens digit and a units digit between 0 and 3. Thus, the output of AND 204 is at 1 whenever the channel number is 10 through 13.

AND 206 is at 1 if both TA' and OR 200 are at 0, corresponding to a channel number from 0 to 19 with an even tens digit (zero is even). Thus, the output of AND 206 is at 1 when the channel number is 0 through 9.

The output of AND 214 is at 1 when AND 206 is at 1 and UB' and UC' are at 1. The first condition is satisfied for channels 0 through 9 and UB' and UC' at 1 corresponds to a units binary X11X. All conditions are satisfied only for numbers 6 and 7 and the output of AND 214 is at 1 only for channels 6 and 7.

AND 216 is at 1 for channel numbers 0 through 9 and UA' and UC' at 1 (binary X1X1). Only numbers 5 and 7 satisfy the conditions and the output of AND 216 is at 1 only for channel numbers 5 and 7. It follows that the output of AND 220 is at 1 when AND 216 and AND 214 are at 1 which only occurs for channel number 7.

The output of AND 212 is at 1 for UD' at 1 (binary 1XXX-units digit 8 or 9) and the channel number is 0 through 9. Only numbers 8 and 9 satisfy these conditions and the output of AND 212 is at 1 for channel numbers 8 and 9.

The output of OR 202 (labelled BA) is at 0 only when all inputs are at 0, corresponding to: numbers 0–19; an even tens digit; not a 7; and not an 8 or 9. Thus, for channel numbers 0–6, BA is 0 and for channels 7–99, BA is at 1.

Similarly, the output of OR 218 (labelled BB) is at 0 only when all its inputs are at 0 corresponding to: not 5–7; not 6–7; not 8–9; and not 10–13. Thus, it is at 0 for all but numbers 5–13. For all other channel numbers BB is at 1. From Table 2 of FIG. 3 it may be seen that BA and BB unambiguously specify the four frequency bands.

The output of NAND 217 will be at 1 (to indicate a VHF channel selection) as long as both inputs ae not at 1. Inverter 215 is employed to permit this input condition only for band 4 channels. Thus, the VHF and UHF tuner sections may be separately activated for appropriate tuning.

The complete interconnection and description of operational blocks is covered in the above incorporated Tanaka application. Here the necessary interconnection to channel computer 67 will be described along with examples showing that the decoded band signals permit establishing proper preset values for the various counters. The full set of preset values are listed in Table 3 of FIG. 3.

Figure 4:
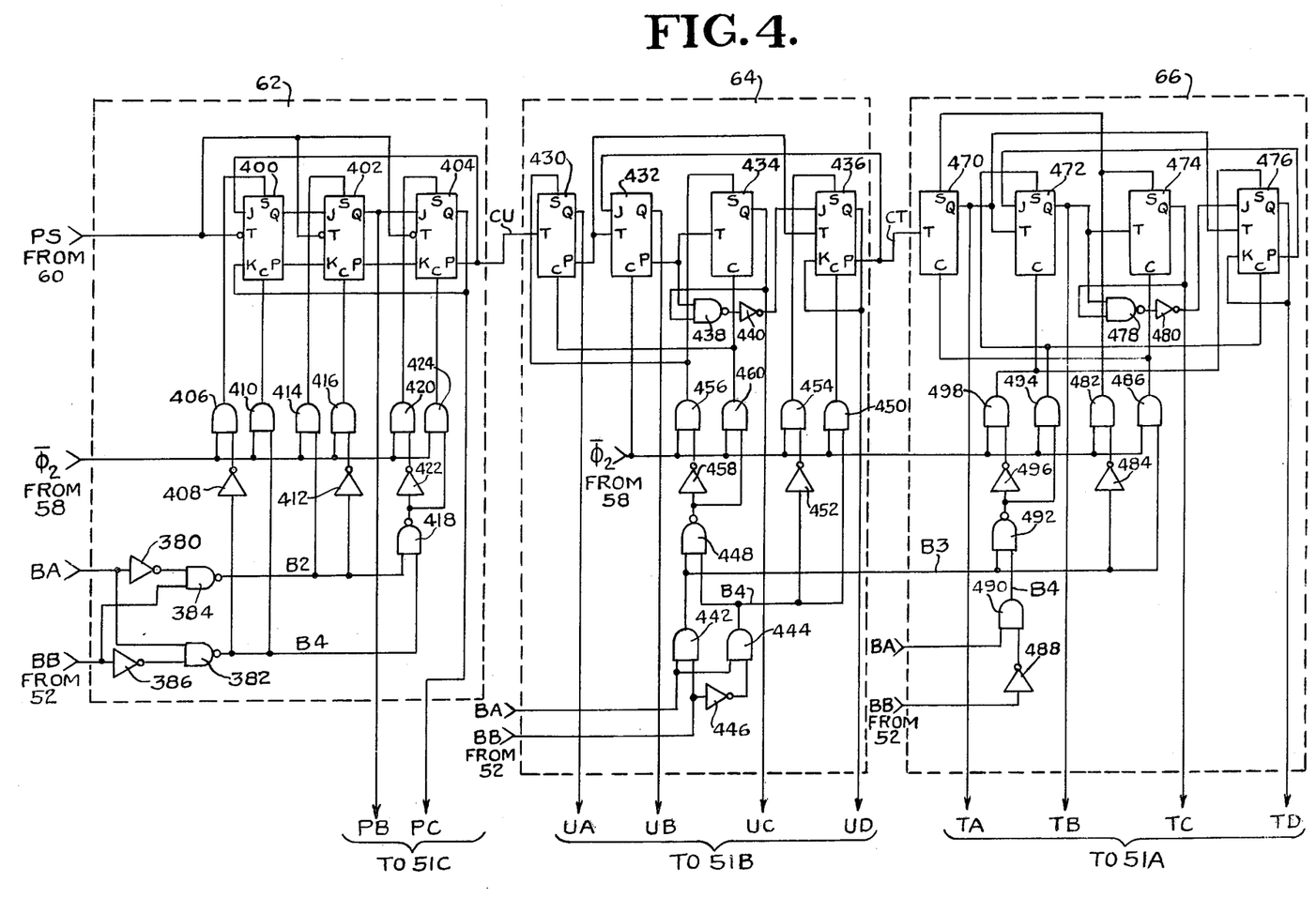
FIG. 4 shows the circuitry for counter blocks 62, 64 and 66 in channel computer 67.

Modular Scaler 62 (FIG. 4)

Modular scaler 62, in conjunction with the units and tens counters, determines the number of PS pulses during a count interval which is representative of the local oscillator frequency. For each PS pulse the modular scaler advances one state. The state preset information selects one of the permissible counting states as the starting point for the counting operation and each time the modular scaler experiences a transition state a CU pulse is delivered to the units counter. The residue count in the modular scaler is subsequently used to define the window for determining when the tuner is tuned to the appropriate intrachannel fractional location. (See Tanaka application)

The modular scaler consists of three JK type flip-flops appropriately connected to provide modular 6 arithmetic counting. It also includes logic circuitry for decoding the appropriate band signals to produce the proper presets for developing the correct residue for comparison with the predetermined residues in the comparator.

The BA and BB leads from band decoder 52 are applied to decoding circuitry. Lead BA is connected to one input of a NAND 382 and, through an inverter 380, to one input of a NAND 384. Lead BB is connected to the second input of NAND 384 and, through an inverter 386, to the second input of NAND 382. A 0 at the output of NAND 384 corresponds to a selected channel in band 2 and a 0 at NAND 382 corresponds to band 4. (See Table 2, FIG. 3) B2 and B4 1 level signals indicate that the selected channel is in Bands 1 or 3 (which have the same preset information).

The JK flip-flops are designated as 400, 402 and 404. The PS signal from NAND 60 is supplied to the T terminal of each of the three flip-flops. The Q and P terminals of flip-flop 400 are connected respectively to the J and K terminals of flip-flop 402. Similarly, the Q and P terminal of flip-flop 402 are connected to the J and K terminals of flip-flop 404. The J terminal of flip-flop 400 is connected to the P terminal of flip-flop 404, which is labelled CU. The K terminal of flip-flop 400 is connected to the Q terminal of flip-flop 404 which is labelled PC. The Q output of flip-flop 402 is labelled PB.

The B4 lead is connected to one input of an AND 410, one input of a NAND 418, through an inverter 408 and to one input of an AND 406. The B2 lead is connected to one input of an AND 414, one input of a NAND 418 and, through an inverter 412, to the second input of an AND 416. The output of NAND 418 is connected to one input of AND 424 and, through an inverter 422, to one input of an AND 420. Timing signal $\phi_2$ is supplied to the second inputs of AND 406, AND 410, AND 414, AND 416, AND 420 and AND 424, for enabling these gates during the reset interval. The output of AND 406 and the output of AND 410 are connected respectively to the set (S) and clear (C) terminals of flip-flop 400. The output of AND 414 and the output of AND 416 are connected respectively to the S and C terminals of flip-flop 402. Similarly, the outputs of AND 420 and AND 424 are connected respectively to the S and C terminals of flip-flop 404.

The modular scaler is thus seen to consist of three flip-flops, interconnected to form a Johnson counter. The number of PS pulses arriving in a count interval is representative of the local oscillator frequency. The state preset information for the modular scaler and the decimal presets for the units and tens counters are shown in Table 3 of FIG. 3. For each PS pulse, the counter advances one state and when the Johnson counter experiences a transition (state six to state 1) a pulse CU is delivered to the units counter. As described in the Tanaka application in the discussion of the window, two adjacent residues are selected for the modular scaler to define the window. For all bands, these residues correspond to states 4 and 5 in the Johnson counter.

Figure 3:
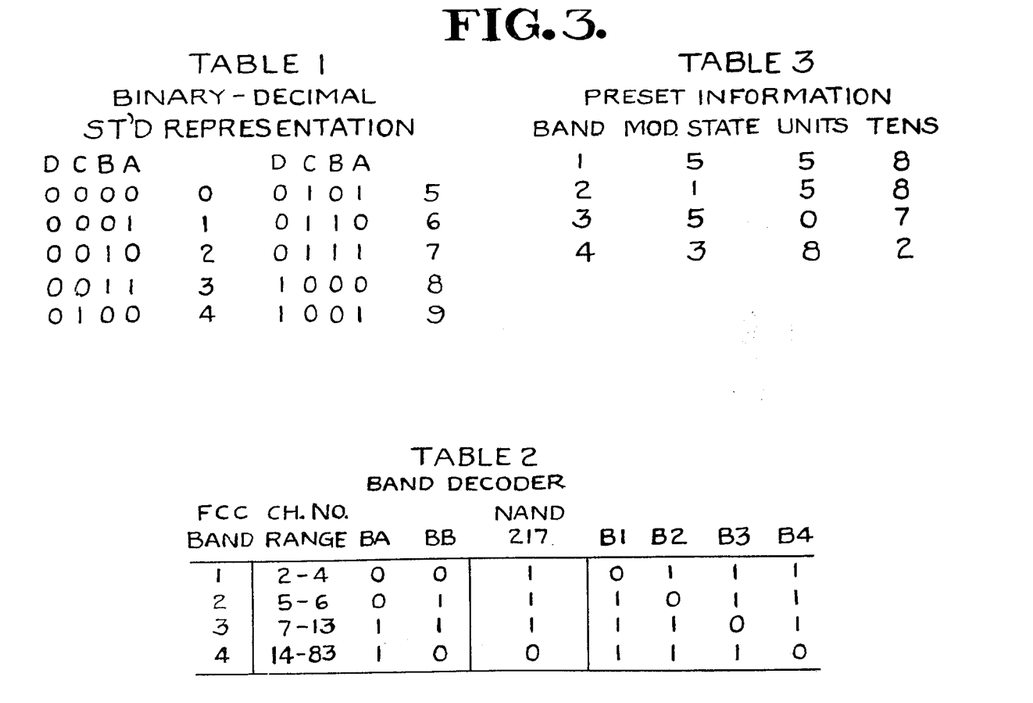

Assume channel 2 is desired and 02 is entered at the keyboard. Since, as will be seen, the comparator will show an inequality, a ramp signal is generated for changing the tuning of the tuner. The input channel number is decoded in the band decoder and leads BA and BB are at 0 (Table 2, FIG. 3). Thus, both B2 and B4 are at 1. Assuming a $\phi_2$ timing signal at 1 (reset), AND 410 is enabled and clears flip-flop 400. A cleared flip-flop has its Q output at 0. B2 at 1 enables AND 414 and flip-flop 402 is set. A set flip-flop has its Q output at 1. B2 and B4 at 1 result in the output of NAND 418 being at 0, which enables AND 420 and sets flip-flop 404. The Q outputs of flip-flops 400, 402 and 404 are at 0, 1 and 1, respectively. This corresponds to state 5 which from Table 3 of FIG. 3 is the correct modular state preset for band 1 channels.

Assume tuning is complete for channel 2. During each count interval 101 PS pulses are supplied to modular scaler 62. Modular division of 101 by 6 (the number of pulses required to cycle the Johnson counter) results in 16R5. Because the counter was preset to state 5, the remainder of 5 pulses drives the counter to state 4 (causing an additional state 6 to state 1 transition in the process). Thus, 17 transitions of the Johnson counter from state 6 to state 1 occur causing a like number of CU pulses. The final status or residue of the counter is state 4, which was previously indicated as an acceptable residue. Because of the asynchronous counting system, however, 102 PS pulses could be supplied to the modular scaler during the count interval when the tuner is tuned to channel 2. This would result in the Johnson counter ending in state 5 which is also acceptable.

As another example assume channel 14 is selected. B2 is at 1 and B4 is at 0. B4 at 0 enables AND 406 which sets flip-flop 400. B2 at 1 enables AND 414 and sets flip-flop 402. B2 and B4 at 1 and 0, respectively, result in a 1 level output signal from AND 418 which enables AND 424 and clears flip-flop 404. The Q outputs of flip-flop 400, 402 and 404 are respectively 1, 1 and 0, corresponding to state 3. A channel number in band 4 has a modular state preset of 3.

When the tuner is tuned to channel 14, its local oscillator frequency is represented by 517 PS pulses. Modular division by 6 results in 86R1. Since the Johnson counter is preset to state 3, the remainder of 1 causes a further advance to state 4 which is acceptable. Similarly, because the system gating is asynchronous, 518 PS pulses may be received during a count interval, resulting in a final state of 5, which is also acceptable. Under either of these conditions, 86 CU pulses are sent to the units counter.

Units Counter 64 (FIG. 4)

Units counter 64 of FIG. 4 comprises a series of four JK flip-flops which are presettable so that in conjunction with the CU transition pulses from the modular scaler its status represents in standard binary form, the units value of the derived channel number. For each units counter transition, represented by the counter advancing from 9 to 0 (in decimal notation), a CT pulse is delivered to the tens counter.

The CU pulses from modulator scaler 62 are applied to the T terminal of a flip-flop 430, the Q terminal of which is labelled UA. Its P terminal is connected to the T terminals of a flip-flop 432, and a flip-flop 436. The J terminal of flip-flop 432 is connected to the P terminal of flip-flop 436, labelled CT. The Q terminal of flip-flop 432 is labelled UB, and the P terminal is connected to the T terminal of a flip-flop 434 and one input of a NAND 438. The Q output of flip-flop 434 (labelled UC) is connected to the second input of NAND 438. The output of NAND 438 is connected, through an inverter 440, to the J terminal of flip-flop 436, the Q terminal of which (labelled UD) is connected to its K terminal. UD, UC, UB and UA correspond to the standard binary representation of the units counter status.

The BA output of band decoder 62 is applied to one input of a NAND 442 and to one input of a NAND 444. Band decoder output BB is applied to the second input of NAND 442 and through an inverter 446 to the second input of NAND 444. A 0 signal level at the output of NAND 442 (B3) corresponds to a channel number in the third frequency band and this output is connected to one input of a NAND 448. Similarly, a 0 signal level at the output of NAND 444 (B4) designates a channel number in the fourth frequency band and this output is connected to the second input of NAND 448, to one input of an NAND 450 and, through an inverter 452, to one input of an AND 454. The output of NAND 448 is connected to one input of an AND 460 and, through an inverter 458, to one input of an AND 456. Timing signal $\bar{\phi}_2$ is applied to the C terminal of flip-flop 432 and to the second input of AND 456, AND 460, AND 454 and AND 450, thus clearing 432 and enabling those gates during the reset interval.

The output of AND 456 is connected to the S terminals of flip-flop 430 and flip-flop 434. The output of AND 460 is connected to the C terminals of these flip-flops. The output of AND 450 and AND 454 are connected respectively to the C and S terminals of flip-flop 436. No connection is made to the S terminal of flip-flop 432 since it doesn't receive a preset for any band.

Assume channel 2 is entered at the keyboard, and $\phi_2$ is at 1, defining the reset interval. Channel 2 is in band 1, and from Table 2 of FIG. 3, B3 and B4 are at 1. The output of NAND 448 is, therefore, at 0 and by virtue of inverter 458, results in both inputs of AND 456 being at 1. Thus, flip-flops 430 and 434 are set. Note that $\bar{\phi}_2$ at a 1 level clears flip-flop 432. Since B4 is also at 1, AND 450 flip-flop 436 and the Q outputs of flip-flops 436, 434, 432 and 430 respectively, are 0101 (UD, UC, UB, UA) which corresponds to a binary representation of decimal 5. Thus entry of a band 1 channel results in the correct preset of 5 in the units counter. (Table 3, FIG. 3)

As discussed for modular scaler 62, for channel 2, 17 CU pulses are delivered to the units counter. With a preset of 5, the 17 pulses cause two 9 to 0 transitions in the units counter resulting in a count status of decimal 2 and 2 CT pulses being sent to the tens counter.

Similarly, upon entry of channel 14, B3 and B4 are at a 1 level and a 0 level respectively. The output of NAND 448 is at 1 enabling AND 460 which clears flip-flops 430 and 434. The $\bar{\phi}_2$ reset signal clears flip-flop 432. B4 at 0, via inverter 452, enables AND 454 which sets flip-flop 436. The status of flip-flops 436, 434, 432 and 430 is respectively 1000 (UD, UC, UB, UA), which is the binary representation of decimal 8. The units preset condition for band 4 is 8.

An input of channel 14 results in 86 CU pulses to the units counter. With a preset of 8, 86 added pulses result in a units counter status of decimal 4, with nine transition pulses (CT) being sent to the tens counter.

Tens Counter 66 (FIG. 4)

Tens counter 66 consists of four presettable JK flip-flops driven by the CT pulses from the units counter for developing a binary representation of the tens digit of the derived channel number.

The CT pulses are applied to the T terminal of a flip-flop 470, the Q output of which is connected to the T terminals of a flip-flop 472 and a flip-flop 476. The Q terminal of flip-flop 470 is labelled TA. The Q output of flip-flop 472, labelled TB, is connected to the T terminal of a flip-flop 474 and to one input of a NAND 478. The Q output of flip-flop 474 is labelled TC and is connected to the second input of NAND 478. The output of NAND 478 is connected, through an inverter 480, to the J terminal of flip-flop 476. The Q and K terminals of flip-flop 476 are interconnected and are labelled TD. TD, TC, TB, TA correspond to the standard binary representation of the counter status.

The B3 signal from NAND 442 in units counter 64 is supplied as one input to a NAND 492, to one input of an AND 486 and, through an inverter 484, to one input to an AND 482. The B4 signal is separately derived from the output of an AND 490. BA is supplied as one input to NAND 490 and BB, through an inverter 488, as its second input. B4 is connected to the second input of NAND 492. The output of NAND 492 is connected to one input of an AND 494 and, through an inverter 496, to one input of an AND 498. Timing signal $\bar{\phi}_2$ is supplied to the second inputs of AND 498, AND 494, AND 482 and AND 486, thus enabling these gates only during the reset interval. The output of AND 482 is connected to the S terminals of flip-flops 470 and 474. The output of AND 486 is connected to the C terminals of flip-flops 470 and 474. The J terminal of flip-flop 472 is connected to the P terminal of flip-flop 476. The output of AND 494 is connected to the S terminal of flip-flop 472 and to the C terminal of flip-flop 476 and output of AND 498 is connected to the C terminal of flip-flop 472 and to the S terminal of flip-flop 476.

Using the example of Channel 2 results in B3 and B4 both being at 1. (Also assume $\bar{\phi}_2$ is at 1 defining the reset interval.) The output of NAND 492 is at 0, which when applied through inverter 496, enables AND 498 for clearing flip-flop 472 and setting flip-flop 476. B3 at 1 enables AND 486 which clears flip-flop 470 and 474. The resulting status of flip-flops 476, 474, 472, and 470 as represented by their Q outputs is binary 1000 (TD, TC, TB, TA), corresponding to decimal 8. From Table 3 of FIG. 3 it may be seen that the tens preset for a channel in band 1 is 8. As discussed above, for channel 2, two CT pulses are supplied from the units counter. These two CT pulses, when added to the decimal 8 preset result in a count status of 0. Therefore, the final status of the tens counter for channel 2 is 0.

Channel 14 is in band 4 with B3 at 1 and B4 at 0. The output of NAND 492 is at 1, enabling AND 494 which sets flip-flop 472 and clears flip-flop 476. B3 at 1 enables AND 486 which clears flip-flops 470 and 474. the resulting status of flip-flops 476, 474, 472 and 470 is binary 0010 (TD, TC, TB, TA) corresponding to decimal 2. The tens preset for a channel in band 4 is 2.

For channel 14 the units counter delivered 9 CT pulses to the tens counter. With a preset of decimal 2, the addition of 9 pulses causes a 9 to 0 transition and the resulting status is 1. As the tuning system need only process two digit channel numbers, no provision is made for recording transitions of the tens counter. The result is decimal 1 which is the correct tens counter status for channel number 14.

The invention disclosed provides a method and apparatus for segregating two digit binary encoded channel numbers according to their location in the four disconnected FCC frequency bands. This information is supplied to a local oscillator tuning frequency computer for establishing appropriate preset information to derive the channel number of the receivable television signal.

While a particular embodiment of the invention has been shown and described, it will be obvious to those skilled in the art that changes and modifications may be made without departing from the invention in its broader aspects and, therefore, the aim in the appended claims is to cover all such changes and modifications as fall within the true spirit and scope of the invention.

What is claimed is:

1. A television tuning control system, comprising:
a tuner having a tunable element operating in several predetermined discrete frequency bands containing a plurality of fixed bandwidth signals identified by assigned channel numbers;
tuning frequency counting means, employing preset counts corresponding to said frequency bands and sampling the frequency of said tunable element, for deriving from said frequency information indicative of the channel number of the corresponding receivable television channel;
channel number selection means;
comparison means coupled between said tuning frequency counting means and said channel number selection means for comparing channel number information from said channel number selection means with channel number information from said tuning frequency counting means;
driving means coupled between said tunable element and said comparison means, for driving said tunable element to change frequency in response to said comparison means; and
channel band determination means coupled between said channel number selection means and said tuning frequency counting means for segregating said channel numbers according to their location in said several predetermined discrete frequency bands, said channel band determination means establishing said preset counts for said tuning frequency counting means.

2. The television tuning control system of claim 1, wherein said channel number selection means includes means for binary encoding separate digits of two digit channel numbers and said channel band determination means includes logic means coupled to said means for binary encoding for accepting said separately encoded channel number digits and for producing signals corresponding to segregation of channel numbers according to their location in said several predetermined discrete frequency bands.

3. The television tuning control system of claim 2, wherein said channel band determination means further includes means coupled to said logic means for developing and holding said preset counts and means coupled to said means for developing and holding for supplying said preset counts to said tuning frequency counting means.

4. The television tuning control system of claim 3, wherein said tuning frequency counting means includes a modular scaler stage, a units digit counter stage and a tens digit counter stage interconnected for binary counting, said means for developing and holding said preset counts including a plurality of pairs of identical logic gates, each of the stages of said tuning frequency counting means being coupled respectively to the outputs of at least one of said pairs, each of said plurality of pairs having one input connected directly and a second input connected through an inverter to said logic means for receiving signals corresponding to the segregation of said channel numbers.

5. The television tuning control system of claim 4, wherein each of said stages of said tuning frequency counting means comprises an arrangement of JK flip-flops, each said flip-flop having a clear and a set terminal, and wherein said means for supplying preset counts comprises interconnections between the outputs of said pairs of identical logic gates with said clear and set terminals of said flip-flops for establishing appropriate voltage levels on said terminals to produce binary representations of said preset counts for said stages by setting the states of the individual flip-flops.

6. The television tuning control system of claim 5, wherein said tuning system includes clock means coupled to individual ones of said pairs of identical logic gates establishing repetitive and distinct reset, count and compare timing intervals, said pairs of identical logic gates being enabled during said reset timing intervals.

7. The television tuning control system of claim 6, wherein said scaler has a modulus of 6 and wherein said preset counts for the scaler, units and tens stages are respectively: 5,5 and 8 for FCC allocated band 1 channels; 1,5 and 8 for FCC allocated band 2 channels; 5,0 and 7 for FCC allocated band 3 channels; and 3,8 and 2 for FCC allocated band 4 channels.

8. In a tuning control system for television tuners containing a tuning element operating in several predetermined discrete frequency bands containing a plurality of fixed bandwidth signals each identified by a designated channel number, tuning frequency counting means, employing preset counts corresponding to said frequency bands, sampling the frequency of said tuning element and relating tuning element frequency to channel number information, channel number selection means, channel band determination means for segregating channel numbers according to their location in said several predetermined discrete frequency bands and establishing preset values for said tuning frequency counting means, comparison means for comparing channel number information from said channel number selection means with the channel number information from said tuning frequency counting means, and driving means changing the frequency of said tunable element under control of said comparison means, the method of operating said tuning control system comprising the steps of:
encoding the individual digits of channel numbers from said channel number selection means;
decoding said encoded channel numbers in accordance with the frequency band in which the corresponding television signal lies;

developing appropriate preset counts for said tuning frequency counting means in accordance with the frequency band decoding, wherein said appropriate preset counts are those predetermined counts corresponding to which of said frequency bands has been decoded; and supplying said appropriate preset counts to said tuning frequency counting means.

9. The method of claim 8, wherein said encoding step employs binary encoding and said decoding step includes the steps of supplying said separately binary encoded individual digits of channel numbers to logic means included in said channel band determination means for segregating channel numbers according to their location in said several predetermined frequency bands, and of producing band signals corresponding to said segregation.

10. The method of claim 9 wherein the step of developing appropriate preset counts includes the step of holding said preset counts, and the step of supplying said appropriate preset counts to said tuning frequency counting means is performed during predetermined timing intervals.

11. The method of claim 10, wherein the step of developing and holding said preset counts further includes applying said band signals to a plurality of pairs of identical logic gates included in said channel band determination means, said band signals being applied directly to one logic gate of a pair of identical logic gates, and through an inverter to the other logic gate of said pair.

12. The method of claim 11, wherein said tuning system includes clock means coupled to individual ones of said pairs of identical logic gates establishing repetitive and distinct reset, count and compare timing intervals, and the step of supplying said appropriate preset counts includes the step of enabling said plurality of identical logic gates during reset timing intervals.

13. The method of claim 12, wherein said tuning frequency counting means includes a modular scaler stage, a units digit counter stage and a tens digit counter stage interconnected for binary counting, each said stage comprising an arrangement of JK flip/flops, and each said flip/flop having clear and set terminals interconnected with the outputs of said pairs of identical logic gates included in said channel band determination means, wherein the step of supplying said appropriate preset counts includes the step of establishing voltage levels on said terminals for setting the states of the individual flip/flops in accordance with the binary representations of the preset counts.

14. The method of claim 13, wherein the scaler has a modulus of 6 and wherein the preset counts for the scaler, units and tens counters are respectively: 5,5 and 8 for FCC allocated band 1 channels; 1,5 and 8 for FCC allocated band 2 channels; 5,0 and 7 for FCC allocated band 3 channels; and 3,8 and 2 for FCC allocated band 4 channels.

* * * * *